United States Patent
Davis et al.

(10) Patent No.: US 6,410,889 B2
(45) Date of Patent: Jun. 25, 2002

(54) METHOD AND APPARATUS FOR REDUCING CONTAMINATION IN A WAFER LOADLOCK OF A SEMICONDUCTOR WAFER PROCESSING SYSTEM

(75) Inventors: Matthew F. Davis, Brookdale; Douglas R. McAllister, Pleasanton; David Evans, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/961,152

(22) Filed: Sep. 21, 2001

Related U.S. Application Data

(63) Continuation of application No. 09/539,158, filed on Mar. 29, 2000.

(51) Int. Cl.$^7$ ............................................. F27D 11/00
(52) U.S. Cl. ..................... 219/390; 219/405; 392/416; 48/724; 438/758; 432/241
(58) Field of Search ................... 219/285, 390, 219/391, 395, 405, 411; 118/724, 725, 50.1; 392/416, 418; 438/758; 432/241

(56) References Cited

U.S. PATENT DOCUMENTS

| | | | | |
|---|---|---|---|---|
| 5,000,682 A | * | 3/1991 | Heidt et al. | 432/241 |
| 5,378,283 A | * | 1/1995 | Ushikawa | 118/719 |
| 5,455,082 A | | 10/1995 | Saito | 427/452 |
| 5,516,732 A | * | 5/1996 | Flegal | 437/250 |
| 5,578,129 A | | 11/1996 | Moriya | 118/719 |
| 5,759,287 A | | 6/1998 | Chen | 134/21 |
| 5,858,108 A | | 1/1999 | Hwang | 134/1.3 |
| 5,972,161 A | | 10/1999 | Kim et al. | 156/345 |
| 6,016,611 A | | 1/2000 | White | 34/92 |
| 6,107,212 A | * | 8/2000 | Fujita | 438/758 |
| 6,110,232 A | * | 8/2000 | Chen et al. | 29/25.01 |

FOREIGN PATENT DOCUMENTS

JP 11-251397 9/1999 ............ H01L/21/68

OTHER PUBLICATIONS

International Search Report prepared by European Patent Office acting as International Searching Authority in counterpart PCT application.

* cited by examiner

*Primary Examiner*—Teresa Walberg
*Assistant Examiner*—Shawntina Fuqua
(74) *Attorney, Agent, or Firm*—Moser Patterson & Sheridan; Joseph Bach

(57) ABSTRACT

A method and apparatus for heating a loadlock to inhibit the formation of contaminants within the loadlock. At least one heater is attached to the walls of the loadlock to boil contaminants from the surfaces within the loadlock. These desorbed contaminants are exhausted from the loadlock by a vacuum pump. Alternatively, a purge gas can be supplied to the loadlock while the loadlock is being heated. The flow of purge gas flushes the desorbed contaminants from the loadlock.

9 Claims, 5 Drawing Sheets

METHOD AND APPARATUS FOR REDUCING CONTAMINATION IN A WAFER LOADLOCK OF A SEMICONDUCTOR WAFER PROCESSING SYSTEM

This application is a continuation of copending U.S. patent application Ser. No. 09/539,158, filed Mar. 29, 2000, which is hereby incorporated by incorporated by reference in its entirety.

BACKGROUND OF THE DISCLOSURE

1. Field of the Invention

The invention relates to semiconductor wafer process systems and, more particularly, the invention relates to a method and apparatus for controlling contamination in a loadlock of a semiconductor wafer processing system.

2. Description of the Background Art

Semiconductor wafer processing systems comprise a loadlock wherein a plurality of wafers are stacked that are awaiting processing within a system. These wafers are removed from the loadlock one at a time by a robot and transported to various processing chambers within the system. Once processed, the wafers are returned from the process chambers to the wafer cassette in the loadlock for removal from the system.

During wafer processing within the system contaminants adsorb onto the wafers. Typically the reactant gases adsorb onto the wafer surface and when the wafer is returned to the loadlock the adsorbed material will desorb. The desorbed gases combine with moisture in the loadlock to form a corrosive film that coats the interior surfaces of the loadlock and the wafers. Such coating of the interior surfaces causes corrosion of the surfaces within the loadlock, and causes the formation of condensation particles upon the wafers. The surface corrosion creates tremendous quantities of corrosion byproduct particulates that disperse throughout the loadlock to contaminate the wafers.

Therefore, a need exists in the art for a method and apparatus that controls corrosive contaminants within a loadlock.

SUMMARY OF THE INVENTION

The disadvantages associated with the prior art are overcome by a method and apparatus that heats the atmosphere of a loadlock. Specifically, the apparatus heats the loadlock to inhibit the formation of corrosive byproduct particles. In addition, the apparatus may supply a purge gas to the loadlock to dilute and remove both moisture and corrosive gases from the loadlock. To provide, heat to the loadlock, at least one heater is attached to the walls of the loadlock to desorb the contaminants from the surfaces within the loadlock. These desorbed contaminants are exhausted from the loadlock by a vacuum pump or flushed from the loadlock by a flow of the purge gas. As such a combination of heating and purging effectively eliminates both the moisture and corrosive gases from the loadlock to eliminate a source of wafer contamination.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
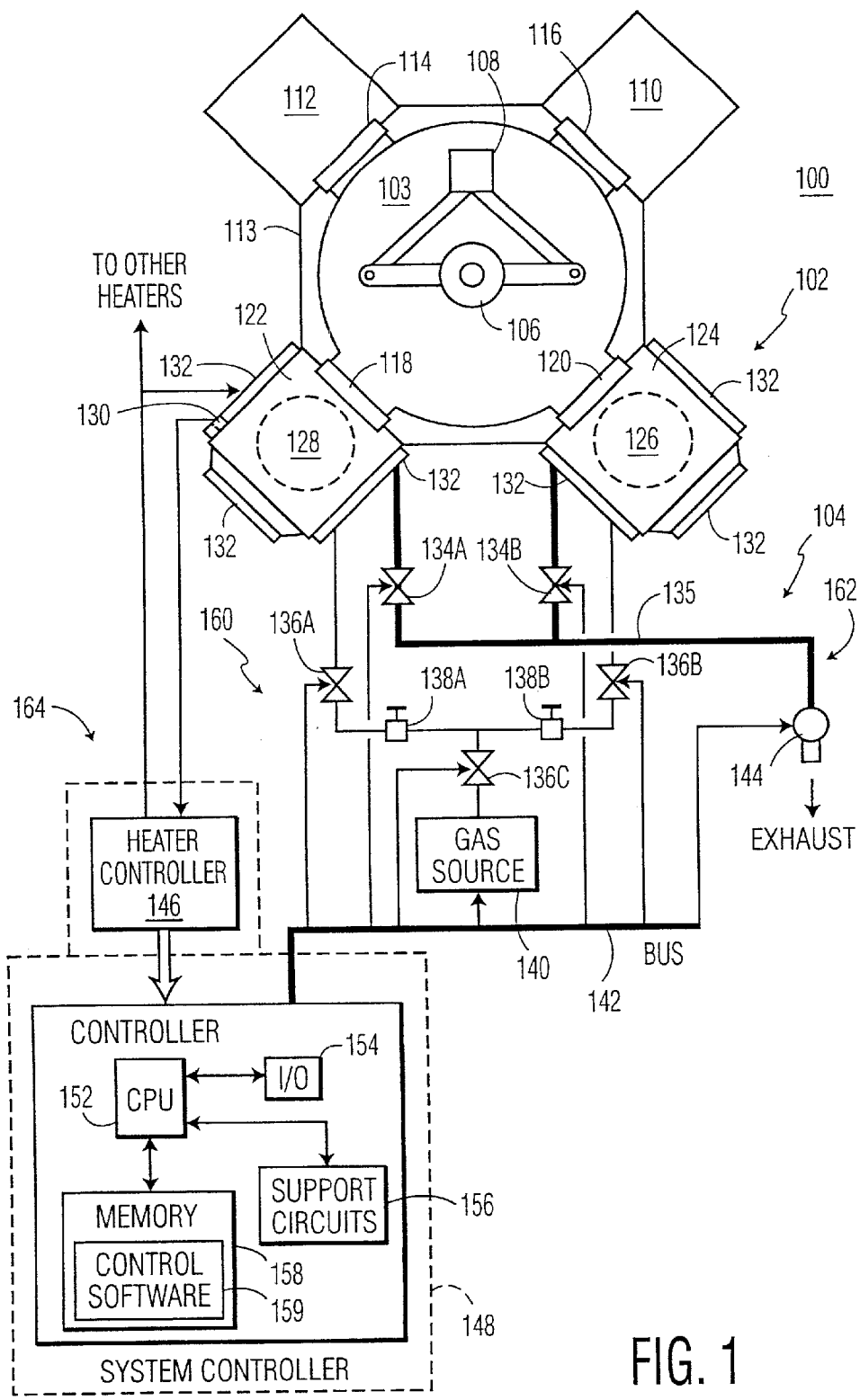
FIG. 1 depicts a semiconductor processing system including apparatus for removing contaminants from one or more loadlocks.

FIG. 1 depicts a semiconductor wafer processing system 100 comprising a system hardware 102 coupled to a loadlock contaminant control system 104 of the present invention. The system hardware operates in a manner that is generally known in the art while the contaminant control system provides a unique technique for heating and exhausting an atmosphere in the loadlock(s) to eliminate a source of wafer contamination. A purge gas may be supplied to the loadlock during heating.

Specifically, the wafer processing hardware 102 comprises a plurality of process chambers 112 and 110, and a pair of loadlocks 122 and 124 coupled to a central platform 113 that contains a transfer chamber 103. Within transfer chamber 104 is a robot 106 having a blade 108 located at the distal of the robot arms and adapted for carrying semiconductor wafers from one process chamber to another and between the loadlocks and the process chambers. The robot's blade 108 has access to the chambers 112 and 110 through respective slit valves 114 and 116. The platform is also coupled to at least one loadlock 122. In the depicted platform there are two loadlocks 122 and 124. Each of the loadlocks 122 and 124 are respectively coupled to the transfer chamber 104 via slit valves 118 and 120.

In operation, wafers 128 and 126 within the loadlocks are accessed by the robot's blade 108 through the respective slit valves 118 and 124. The wafers are carried to a particular process chamber 112 or 110 wherein they are processed and then returned to the loadlock for removal from the system. Typically corrosives and other processing byproducts adsorb upon the wafers as they are processed within chambers 112 and 110 and the loadlock contamination control system 104 removes these corrosives. As such, the corrosives are prevented from attacking the interior surfaces of the loadlocks and combining with loadlock moisture to form condensation particles on unprocessed wafers in the loadlock.

In one embodiment of the invention, the contamination control system 104 comprises a gas input subsystem 160, a gas exhaust subsystem 162 and a loadlock heating subsystem 164. The gas input subsystem 160 is optional. The gas input subsystem 160 comprises a gas source 140, a plurality valves 136A, 136B and 136C, and a plurality of set screws 138A and 138B. The exhaust subsystem comprises a pair of valves 134A and 134B and a pump 144. The heater subsystem comprises a heater controller 146, a thermocouple 130 and at least one heater element 132 that is attached or embedded in the side wall or side walls of the loadlock 122 and/or 124.

In operation, the gas source 140 supplies an inert gas such as nitrogen through valves 136C through the set screws 138A and 138B and valves 136A and 136B to the loadlocks 122 and 124. The set screws 138A and 138B are needle valves that, upon a system initialization, are used to set the flow rates into the chamber such that the flow of gas is balanced between one loadlock and the other such that the pressure within the loadlocks is in the correct regime for efficient removal of moisture and corrosives. The plurality of valves 136A, 136B and 136C are used to control the flow of gas to the respective loadlocks such that the gas can be decoupled from a loadlock that is being opened to remove or add additional wafers to the loadlock.

The pumping system comprises a pair of exhaust valves 134A and 134B that are coupled to a manifold 135 that carries the exhaust gases to the pump 144. In this manner the inert gas is supplied to the loadlock, flows through the loadlock causing contaminants to be removed from the loadlock via the gas flow to the pump 144. The gas flow is maintained at approximately 250 sccm where a pressure of 400–500 mT is maintained within each of the loadlocks.

To inhibit the formation of corrosive particles on loadlock surfaces, at least one heater element 132 is attached or embedded in the side wall of each of the loadlocks 122 and 124. A heater controller applies electric current to the heater element to heat the interior gas in the loadlock 122. The interior of the loadlock is maintained at approximately 50–55° C. or more. To facilitate dynamic control of the heating process at least one thermocouple 130 is attached to the loadlock wall. The output voltage from the thermocouple 130 is coupled to the heater controller 146 which, in response to the signal from the thermocouple, modifies the voltage applied to the heater to maintain a constant temperature within the loadlock. The temperature change from top to bottom within the loadlock is approximately 5–6° C. To facilitate this stringent temperature differential the heater controller 146 is used to control a plurality of zones of heater elements and a plurality of thermocouples are used to provide feedback voltage with respect to each zone. A detailed description of the zonal heater control system is provided with respect to FIG. 4.

The contaminant control system 104 comprises a controller 150 which may form part of the wafer processing system controller 148. The controller 150 comprises a central processing unit (CPU) 152, a memory 158, support circuits 156 and input/output (I/O) circuits 154. The CPU 152 is a general purpose computer which when programmed by executing software 159 contained in memory 158 becomes a specific purpose computer for controlling the hardware components of the contaminant control system 104. The memory 158 may comprise read only memory, random access memory, removable storage, a hard disk drive, or any form of digital memory device. The I/O circuits comprise well known displays for output of information and keyboards, mouse, track ball, or input of information. The support circuits 156 are well known in the art and include circuits such as cache, clocks, power supplies, and the like.

The memory 158 contains control software 159 that when executed by the CPU 152 enables the controller to digitally control the various components of the contaminant control system 104. A detailed description of the process that is implemented by the control software is described with respect to FIG. 5.

Although the heater controller 146 is generally autonomous, the heater controller 146 provides the controller with fault and error information regarding the heater operation. Alternatively, the heater controller may be a portion of the controller 150 of the digital system. In fact, the controller 148 of the semiconductor wafer processing system 102 that controls the processes that occur within system 102 as well as the contaminant control system 104 may also incorporate the heater controller 146 as depicted by the dashed box that circumscribes the controller 150 as well as the heater controller 146.

Figure 2:
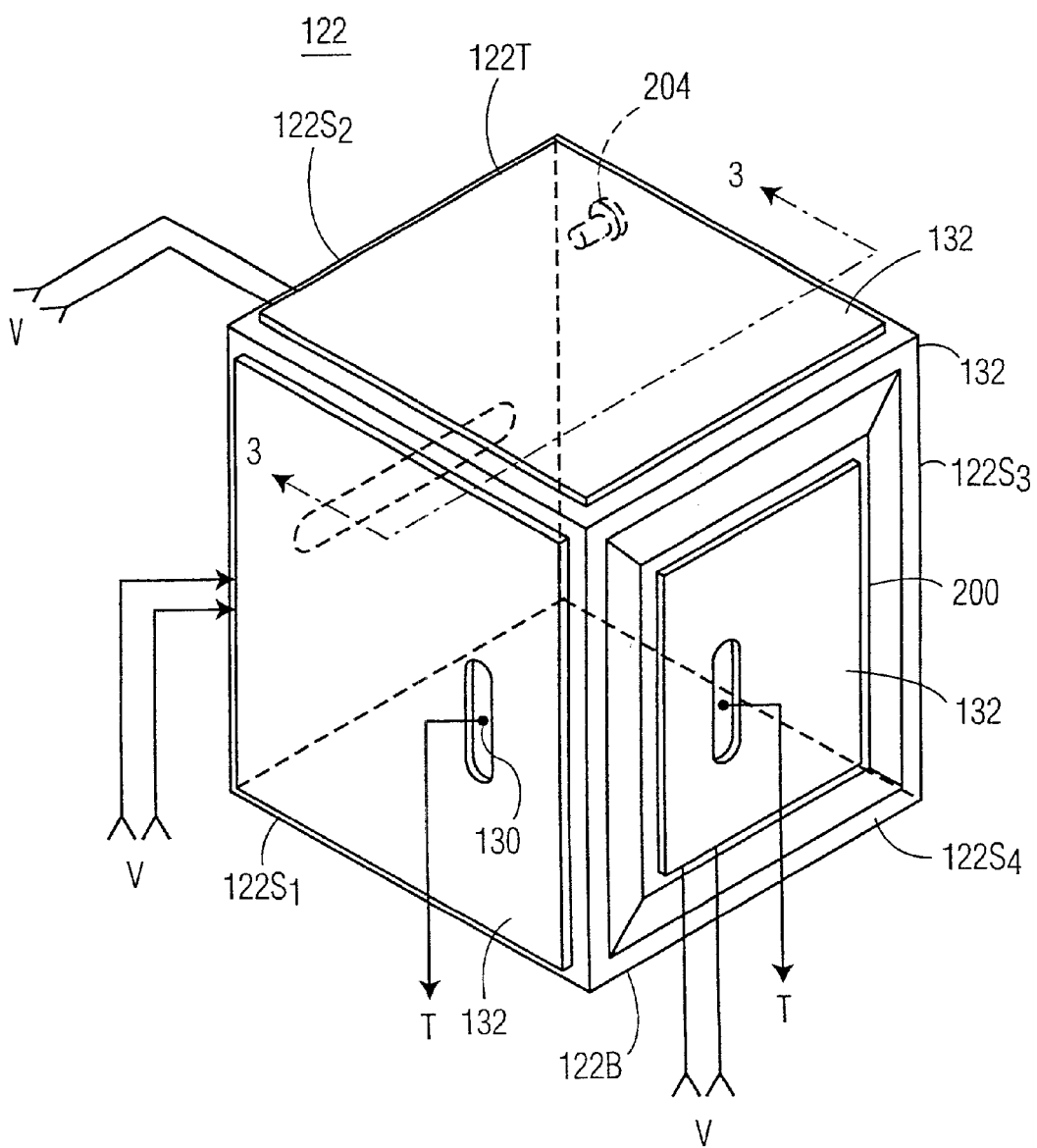
FIG. 2 depicts a perspective view of a loadlock having a plurality of blanket heaters attached to the exterior surfaces of loadlock.
Figure 3:
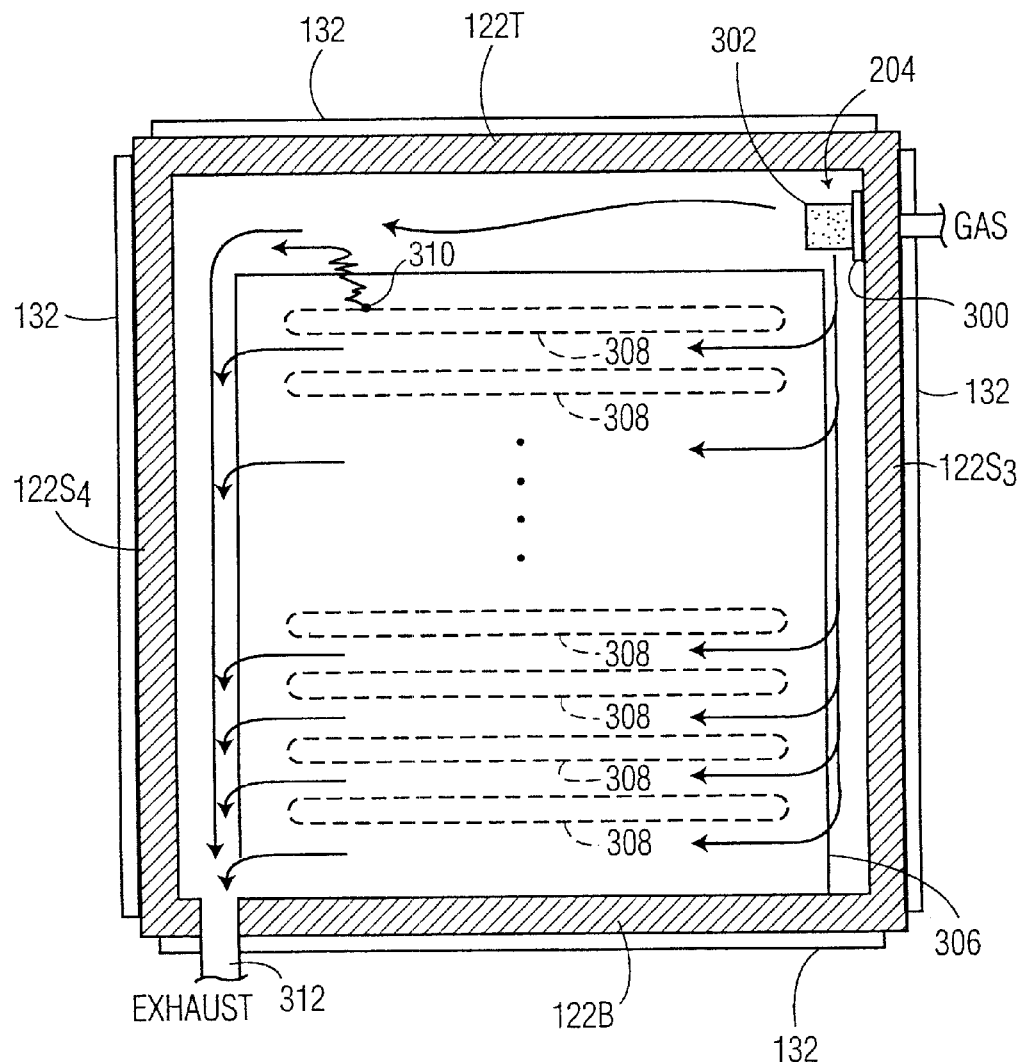
FIG. 3 depicts a cross-sectional view of the loadlock of FIG. 2 taken along line 3—3.

FIG. 2 depicts a perspective view of an individual loadlock 122, while FIG. 3 depicts a cross-sectional view of the loadlock 122 taken along lines 3—3 in FIG. 2. FIGS. 2 and 3 should be referred to simultaneously to best understand the invention.

Loadlock 122 comprises a top 122T, a bottom 122B, and four sides $122S_1$–$122S_4$. The side $122S_4$ contains an aperture that is covered by a door 200. The door 200, the top side 122T, the bottom side 122B as well as sides $122S_1$ and $122S_3$, have attached thereto a heater element 132. The heater elements 132 in the embodiment depicted are self-adhesive resistive blanket heaters. Alternatively, the resistive blanket heaters 132 can be replaced by embedded heater cartridges as well as conduits carrying heated fluid. Other external heaters such as infra-red lamps are also considered within the scope of the invention. The heaters are required to heat the internal atmosphere of the loadlock 122 to a temperature that will desorb the contaminants that are contained within the loadlock. An adsorbed molecule of corrosive gas (represented at reference 310) is desorbed by the heating of the atmosphere within the loadlock 122 and exhausted from the loadlock by the purge gas flow. A typical adsorbed material comprises hydrogen bromide (HBr) and is desorbed by a temperature of 50–55° C. or more.

Gas is provided through a porous ceramic element 204. The element 204 comprises an electro-polished stainless steel mounting flange 300 and an alumina portion 302 having a 0.5 micron pore size. The ceramic element 204 is mounted to the side wall $122S_3$ via the flange 300 and a conduit carrying the inert gas is coupled to the element 204. The flange 300 is sealed to the wall $122S_3$. The gas enters the chamber and is dispersed by the ceramic element such that the gas does not enter at a high velocity and the gas is distributed through the wafers 308 contained in the wafer cassette 306. To ensure that recondensation of corrosives does not occur in the exhaust manifold, heater elements may be placed on the conduits that lead to the pump to maintain the conduits at elevated temperatures.

Figure 4:
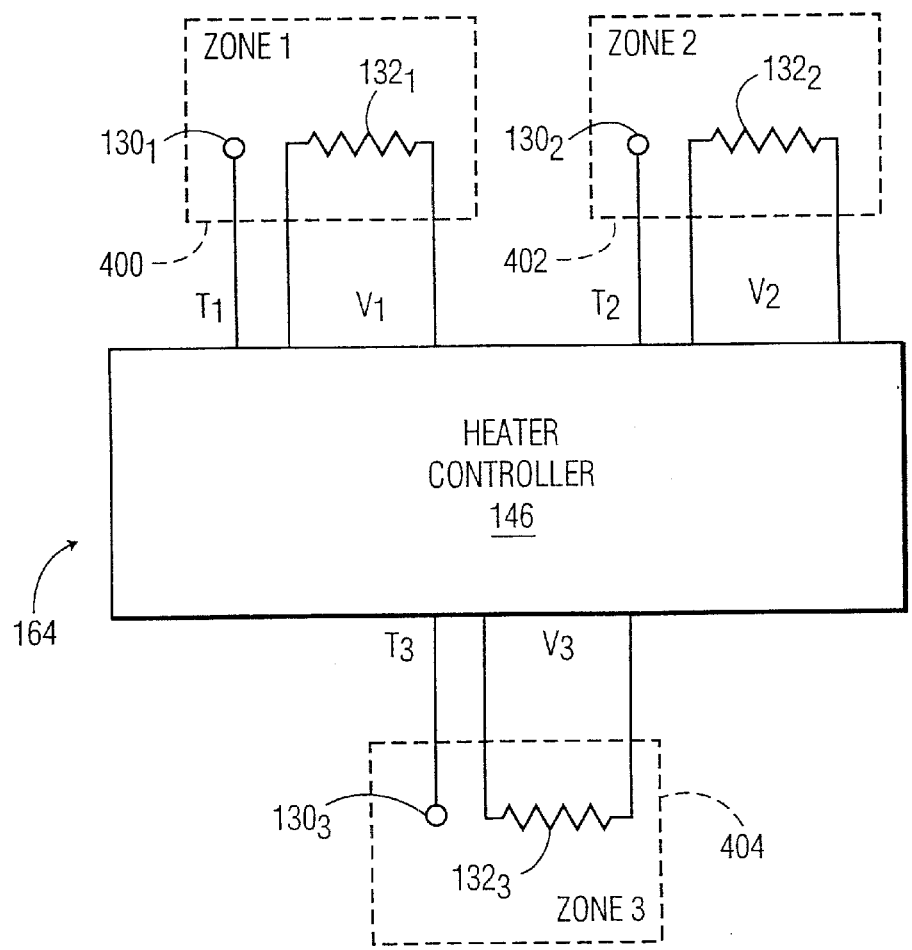
FIG. 4 depicts a schematic design of a heater arrangement.

FIG. 4 depicts a schematic diagram of the heating system 164 comprising the heater controller 146 as well a plurality of heating zone circuitry 400, 402 and 404. Each zone comprises a thermocouple $130_1$, $130_2$ and $130_3$ and a heating element $132_1$, $132_2$ and $132_3$. Any given zone may comprise multiple heating elements such that multiple regions of the loadlock are heated in response to one or more thermocouple signals. For example, zone 400 may comprise a thermocouple on one side of the loadlock and heating elements on sides $122S_1$, $122S_2$ and $122S_4$. While a second zone 402 may comprise a thermocouple $130_2$ on the door 200 and a heating pad 132 also located on the door. The third zone may comprise a thermocouple on the top 122T of the chamber and a heating pad 132 located on the top. Each zone is independently controlled to adjust the temperature such that an attempt is made to uniformly heat the atmosphere within the loadlock. Through use of a standard feedback circuit to monitor a voltage that is generated with respect to the temperature of the thermocouple, the current driven to the heater is controlled. As such, the temperature throughout the loadlock is held uniform to within plus or minus 5° C. while the overall temperature is about 50° C. Higher temperatures may also be used.

When two chambers are simultaneously used as shown in FIG. 1, the valve assemblies are used to enable one loadlock to be used for supplying wafers to the hardware while the second loadlock is open to atmosphere. As such, any combination of venting and pumping between the two chambers 122 and 124 can be provided. With the selective opening and closing of the valves, the system of the present invention avoids backstreaming of gases from one chamber to another.

Figure 5:
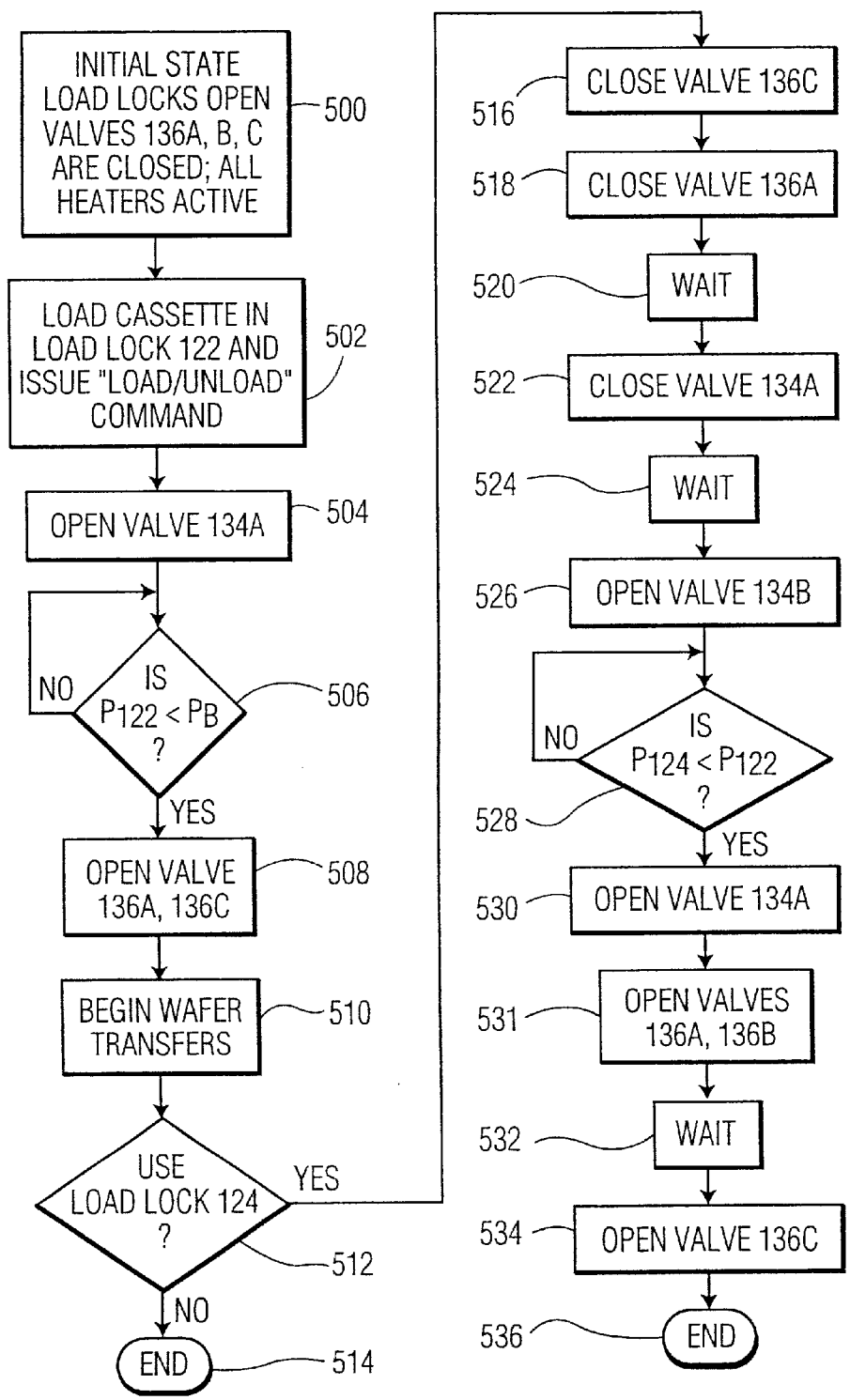
FIG. 5 depicts a flow diagram representing operation of the present invention.

FIG. 5 depicts a flow diagram of a process used by the invention. This process provides any combination of pumping and venting either or both loadlocks 122 and 124 of FIG. 1. The process 550 is implemented by executing control software 159 upon CPU 152. The process 550 begins with the system 104 in an initial state where the loadlocks 122 and 124 are open, valves 136A, B, C are closed and all the heaters are active. At step 502, a cassette of wafers is placed in the loadlock 122 and the door is closed when the loadlock issues a "LOAD/UNLOAD" command. At step 504, the valve 134A is opened. Ag step 506, the routine queries whether the pressure in loadlock 122 ($P_{122}$) is less than the base loadlock pressure ($P_B$) When the loadlock pressure attains the base pressure, the routine proceeds to step 508. At step 508, the valves 136A and 136C are opened and the loadlock 122 is evacuated to a nominal pressure of 400–500 mT. At step 510, as the gas and heat remove contaminants, the wafers are transferred one by one into and out of the wafer processing hardware 102. At step 512, the process queries whether the second loadlock 124 is to be used. Generally, this query is answered by a cassette being placed in loadlock 124 and a "LOAD" button being depressed. If the LOAD request is not made, the process ends at step 514. If the LOAD request is made, the process 550 proceeds to step 516.

At step 516, valve 136C is closed to temporarily stop the flow of inert gas. Then, at step 518, valve 136A is closed to isolate the loadlocks from one another. A delay of about one second occurs at step 520 before, at step 522, the valve 134A is closed to isolate the pump from loadlock 122. After a delay of about one second occurs at step 524, step 526 opens valve 134B. At step 528, the routine queries whether the pressure in loadlock 124 is less than the pressure in loadlock 122. When the pressure in loadlock 124 ($P_{124}$) is greater than or equal to the pressure in loadlock 122 ($P_{122}$), the routine proceeds to step 530. Then, at step 530, the valve 134A is opened to pump the loadlock 124 to 400–500 mT. At step 531, valves 136A and 136B are opened. Then, at step 532, the routine waits for a delay of about one second. To apply inert purge gas, valve 136C is opened at step 534 and the process 550 ends at step 536. At this time, both loadlocks 550 are being heated and purged of contaminants.

To unload a wafer cassette, an operator generally depresses an "UNLOAD" button corresponding to one of the loadlocks, e.g., loadlock 122. An automatic unload sequence may also be executed by the software. In either instance, the valve 136A is closed, then valve 134A is closed. The loadlock atmosphere is then vented to atmospheric pressure with nitrogen. In this manner either loadlock can be isolated from the contaminant control system to allow a cassette to be removed, while the other loadlock is used. Once a new cassette is loaded, the loadlock 122 can be pumped and purged using steps 516 through 536 of process 550; however valve 136B is substituted for 136A and valves 134B is substituted for 134A and so on. Also, to unload loadlock 124, the process described above for unloading loadlock 122 can be used, except valves 134B and 136B are used to isolate loadlock 124.

Although various embodiments which incorporate the teachings of the present invention have been shown and described in detail herein, those skilled in the art can readily devise many other varied embodiments that still incorporate these teachings.

What is claimed is:

1. An apparatus for controlling contaminants in a pair of loadlocks comprising the steps of:

a first heater for heating a first loadlock while simultaneously flowing purge gas through said first loadlock, where an atmosphere of said first loadlock is at a first pressure;

a valve for stopping the flow of purge gas to said first loadlock by isolating said first loadlock from a source of purge gas and a vacuum pump;

means for isolating said first loadlock from a second loadlock;

a second heater for heating said second loadlock while simultaneously flowing purge gas through said second loadlock, where an atmosphere of said second loadlock in at a second pressure; and when said first pressure and said second pressure are the same connecting said first chamber to said vacuum pump and said source of purge gas.

2. The apparatus of claim 1 wherein said purge gas in an inert gas.

3. The apparatus of claim 2 wherein the inert gas is nitrogen.

4. The apparatus of claim 1 wherein said first and second heaters heat the atmosphere within each of the loadlocks to about 50° C.

5. The apparatus of claim 1 further comprising:

means for isolating a select loadlock from said purge gas source and said vacuum pump; and means for venting an atmosphere of said select loadlock.

6. The apparatus of claim 1 wherein said heating inhibits a corrosive reaction within said loadlocks.

7. The apparatus of claim 1 wherein said heating is independently applied to a plurality of heating zones.

8. The apparatus of claim 1 wherein said heating inhibits the formation of corrosion particles within said loadlocks.

9. The apparatus of claim 1 wherein a temperature of said loadlocks resulting from said heating is dynamically controlled.

* * * * *